United States Patent
Vollrath et al.

(10) Patent No.: US 7,402,859 B2
(45) Date of Patent: Jul. 22, 2008

(54) FIELD EFFECT SEMICONDUCTOR SWITCH AND METHOD FOR FABRICATING IT

(75) Inventors: Joerg Vollrath, Olching (DE); Marcin Gnat, Mering (DE); Ralf Schneider, Munich (DE); Stephan Schroeder, Munich (DE)

(73) Assignee: Infineon Technologies AG, Munich (DE)

( * ) Notice: Subject to any disclaimer, the term of this patent is extended or adjusted under 35 U.S.C. 154(b) by 406 days.

(21) Appl. No.: 11/079,884

(22) Filed: Mar. 15, 2005

(65) Prior Publication Data
US 2005/0205946 A1 Sep. 22, 2005

(30) Foreign Application Priority Data
Mar. 16, 2004 (DE) .................. 10 2004 012 629

(51) Int. Cl.
*H01L 27/108* (2006.01)
*H01L 21/336* (2006.01)
(52) U.S. Cl. ............... 257/301; 257/327; 257/372; 257/E27.092; 438/259; 438/268; 438/270
(58) Field of Classification Search .......... 257/301, 257/502, 504, 506, 510, 345, 327, 372; 438/234, 438/244, 258, 259, 268, 270
See application file for complete search history.

(56) References Cited

U.S. PATENT DOCUMENTS

| | | | |
|---|---|---|---|
| 4,885,618 A | 12/1989 | Schubert et al. | |
| 4,907,047 A | 3/1990 | Kato et al. | |
| 6,180,975 B1 | 1/2001 | Radens et al. | |
| 7,057,238 B2 * | 6/2006 | Kim et al. ............... | 257/345 |
| 2003/0034543 A1 | 2/2003 | Lai et al. | |
| 2003/0230786 A1 | 12/2003 | Kim et al. | |

FOREIGN PATENT DOCUMENTS

| | | |
|---|---|---|
| DE | 101 28 211 C1 | 7/2002 |
| EP | 0 599 506 | 6/1994 |
| JP | 59231863 | 12/1984 |
| JP | 09-036364 | 2/1997 |

OTHER PUBLICATIONS

German Office Action mailed on Oct. 24, 2006.

* cited by examiner

*Primary Examiner*—Hsien-ming Lee
(74) *Attorney, Agent, or Firm*—Slater & Matsil, L.L.P.

(57) ABSTRACT

A field effect semiconductor comprises a semiconductor layer having a surface, a first and a second semiconductor region in the semiconductor layer, which are arranged next to one another at the surface of the semiconductor layer, an insulating layer between the first semiconductor region and the second semiconductor region, a semiconductor strip on the surface of the semiconductor layer, which semiconductor strip overlaps the first semiconductor region and the second semiconductor region and adjoins these. A gate overlaps the semiconductor strip at least in the region of the insulating layer. A gate dielectric insulates the gate from the semiconductor strip the first semiconductor region and the second semiconductor region. The semiconductor strip and the gate being formed such that the semiconductor strip is electrically insulating at a first predetermined gate voltage and is electrically conductive at a second predetermined gate voltagero.

23 Claims, 2 Drawing Sheets

FIELD EFFECT SEMICONDUCTOR SWITCH AND METHOD FOR FABRICATING IT

CLAIM FOR PRIORITY

This application claims the benefit of priority to German Application No. 10 2004 012 629.1-33, filed on Mar. 16, 2004, the contents of which are hereby incorporated by reference.

TECHNICAL FIELD OF THE INVENTION

The present invention relates to a field effect semiconductor switch having a low leakage current, which can be used in particular as or instead of a selection transistor of a memory cell of a memory component.

BACKGROUND OF THE INVENTION

Transistors, in particular metal oxide semiconductor field effect transistors (MOSFETs MOSFET=Metal Oxide Semiconductor Field Effect Transistor), enjoy numerous applications in all areas of electronics, from power electronics through to large scale integrated circuits, for example memory components.

With the increasing reduction of feature sizes in integrated components and the associated scaling of the field effect transistors, various problems have to be surmounted. These include in particular the diffusion of the source or drain region or of the dopants thereof into the channel region below the gate and the formation of space charge regions between the source and drain regions, on the one hand, and the channel region, on the other hand. Both effects reduce the effective length of the gate. In order that the effective length of the gate has a minimum value, the distance between the source region and the drain region must therefore have a minimum magnitude and cannot be decreased to the desired extent. This prevents or restricts further miniaturization.

A gradual improvement is conventionally achieved by means of so-called halo implantations at the pn junctions or by reducing the implantation dose. The halo implantation is complicated since it requires additional method steps. Reducing the implantation dose reduces the number of degrees of freedom in the design of the component and results in particular in a reduction of the charge carrier density and of the electrical conductivity.

Insofar as the shortening of the effective length of the gate is not prevented or compensated for, it results in an increase in the leakage current or a reduction of the source-drain resistance in the switched-off state of the field effect transistor. If the field effect transistor is the selection transistor of a memory cell of a memory circuit, the increased leakage current results in a faster discharge of the storage capacitor. This in turn requires an increase in the capacitance of the storage capacitor or a shortening of the refresh circles of the memory component. Both adversely affect the power demand and the thermal budget of the element.

SUMMARY OF THE INVENTION

The present invention includes a field effect semiconductor switch having a low leakage current and a method for fabricating it.

The present invention discloses, in one embodiment, electrically insulating from one another two semiconductor regions lying next to one another below a surface of a substrate by means of an insulating layer and of providing a semiconductor strip on the surface of the substrate, which semiconductor strip overlaps each of the two semiconductor regions, and the conductivity of which semiconductor strip is switchable by means of an overlying gate.

One advantage of the present invention is that the lateral dimensions of this switch can be chosen substantially freely since it is not necessary to take account of diffusion length of dopants or space charge zones. Minimum lateral dimensions are essentially determined by the thickness of the insulating layer between the two semiconductor regions. However, the insulating layer can readily be made very thin.

The field effect semiconductor switch according to the invention can be embodied in particular as a field effect transistor in which one of the two semiconductor regions is a transistor electrode, in particular a source or drain region, and in which the other semiconductor region has a channel region. At one end, the channel region overlaps the semiconductor strip and preferably adjoins the insulating layer. The opposite end of the channel region adjoins a second transistor electrode. The gate completely overlaps the channel region. The electrical conductivities both of the channel region and of the semiconductor strip are switchable by means of different predetermined voltages or potentials at the gate.

Since, in the case of the field effect transistor according to the invention, not only the channel region but also the semiconductor strip is depleted in the switched-off state, the result is a particularly high source-drain resistance and thus a particularly low leakage current.

One variation of the field effect transistor according to the invention comprises channel regions on both sides of the insulating layer. To put it another way, the channel region is interrupted by the insulating layer in the case of this variant by comparison with a conventional field effect transistor.

Even if the channel region has an undesirably low resistance in the switched-off state on account of a diffusion of dopants from one transistor electrode into the channel region or on account of a space charge zone that fills a considerable part of the channel region, a high source-drain resistance is obtained overall on account of the high electrical resistance of the fully depleted semiconductor strip.

It is advantageous for the semiconductor strip not to be produced until after the process steps in which the substrate is exposed to relatively high temperatures. This prevents a diffusion of dopant from substrate regions near the surface into the semiconductor strip.

In accordance with a particular aspect of the present invention, an integrated semiconductor component comprises a field effect semiconductor switch according to the invention.

The field effect semiconductor switch according to the invention can be used particularly advantageously as or instead of a selection transistor of a memory cell in a memory component. In accordance with a particular aspect of the present invention, a memory component comprises a field effect semiconductor switch according to the invention and a storage capacitor, one of the two semiconductor regions of the field effect semiconductor switch being connected to a capacitor electrode of the storage capacitor.

In accordance with a preferred exemplary embodiment, the storage capacitor is a trench capacitor. The substrate preferably comprises a component semiconductor layer at the surface and, underneath and insulated from the latter, a conductive layer to which the outer capacitor electrode of the trench capacitor is connected. The upper end of the inner capacitor electrode of the trench capacitor merges into one of the two semiconductor regions of the field effect semiconductor switch. An insulating collar or insulator collar that laterally surrounds the inner capacitor electrode or the semiconductor region in the region of the component semiconductor layer and electrically insulates it from the component semiconductor layer forms the insulating layer of the field effect semiconductor switch. In the case of an array of such memory cells comprising in each case a field effect semiconductor switch according to the invention and a trench capacitor, gates arranged next to one another along one direction form a word line. The semiconductor regions of the field effect semiconductor switches arranged next to one another along the direction perpendicular thereto, said semiconductor regions not being connected directly to the inner capacitor electrodes, are connected to a bit line.

BRIEF DESCRIPTION OF THE DRAWINGS

Preferred exemplary embodiments of the present invention are explained in more detail below with reference to the accompanying figures, in which.

DETAILED DESCRIPTION OF THE INVENTION

Figure 1:
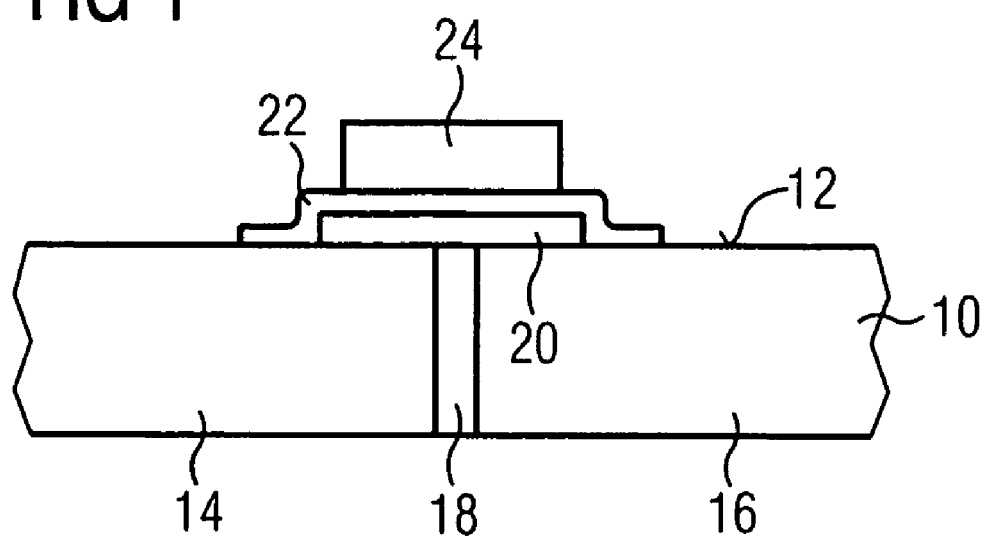
FIG. 1 shows a field effect semiconductor switch in accordance with a first preferred exemplary embodiment of the present invention.

FIG. 1 is a schematic illustration of a vertical section through a semiconductor layer, which is preferably formed as a substrate 10 having a surface 12. By way of example, the semiconductor layer illustrated in FIG. 1 is a self-supporting layer that is designated as a substrate without limiting the generality. As an alternative, the layer illustrated is arranged on one or more layers (not illustrated). By way of example, it is arranged on an insulating layer or an insulator such as glass, ceramic, plastic, corundum or sapphire, or on a semiconductor layer with majority charge carriers having the opposite sign, with the result that a (reverse-biased) pn junction forms in between.

In the substrate 10, a first semiconductor region 14 and a second semiconductor region 16 are arranged adjacent to one another. The two semiconductor regions 14, 16 in each case comprise an n- or p-doped and thus electrically conductive semiconductor material. The semiconductor material is silicon, germanium or gallium arsenide, by way of example.

A thin insulating layer 18 is arranged between the semiconductor regions 14, 16 and electrically insulates the semiconductor regions 14, 16 from one another. A semiconductor strip 20 is arranged on the surface 12 of the substrate 10 and overlaps each of the two semiconductor regions 14, 16, in which case it does not have to completely overlap each of the two semiconductor regions 14, 16. The semiconductor strip 20 has a semiconductor material that preferably corresponds to the semiconductor material of one or both semiconductor regions 14, 16. The semiconductor material of the semiconductor strip 20 is preferably doped, the sign of the majority charge carriers corresponding to that of the semiconductor regions 14, 16.

Arranged above the semiconductor strip 20 is a gate dielectric 22 and, above the latter, a gate 24. The gate dielectric extends in the lateral direction at least to an extent such that the gate 24 is reliably isolated and electrically insulated from the semiconductor strip 20. Furthermore, the gate dielectric preferably extends over the entire semiconductor strip 20.

The gate 24 extends laterally at least to an extent such that it overlaps both the first semiconductor region 14 and the second semiconductor region 16. The gate 24 may have the same size and lateral form as the semiconductor strip 20 or else be smaller or larger than the latter and partly or completely overlap the latter.

On account of the arrangement and the electrical insulation property of the insulating layer 18, there is a single possible current path between the first semiconductor region 14 and the second semiconductor region 16. Said current path passes via the semiconductor strip 20. The electrical connection between the semiconductor regions 14, 16, or its resistance is thus determined by the semiconductor strip 20.

The semiconductor strip 20 is formed, in particular with regard to its thickness and its doping, such that it is fully depleted by a first predetermined voltage at the gate 24, or no longer has any mobile charge carriers, and has mobile electrical charge carriers (electrons or holes) and is thus electrically conductive in the case of a second predetermined voltage at the gate 24. Variable intermediate values of the electrical resistance of the semiconductor strip 20 can be set by applying voltages between the first predetermined voltage and the second predetermined voltage to the gate 24.

In accordance with one variation of the present invention, the gate 24 does not overlap one or both semiconductor regions 14, 16, but rather reaches in the lateral direction only as far as the edge of the respective semiconductor region 14, 16 or as far as the edges of the semiconductor regions 14, 16. The minimum length of the gate measured in the current flow direction thus corresponds to the thickness of the insulating layer 18. This has the consequence that the electrical conductivity of an only minimally short section of the semiconductor strip 20 is influenced by the gate.

In order to obtain the described switching function of the semiconductor strip 20, the latter preferably has a thickness of 50 nm or less. The semiconductor strip 20 particularly preferably has a thickness of 10 nm or less. Given such a small thickness, it is readily possible, with a relatively small voltage at the gate 24, to fully deplete the semiconductor strip 20 and thus to bring about a high electrical resistance between the semiconductor regions 14, 16. The semiconductor strip 20 preferably comprises polycrystalline or epitaxially deposited monocrystalline semiconductor material, in particular silicon. If the semiconductor strip 20 is n-doped, it can be depleted by applying a negative voltage to the gate 24.

Figure 2:
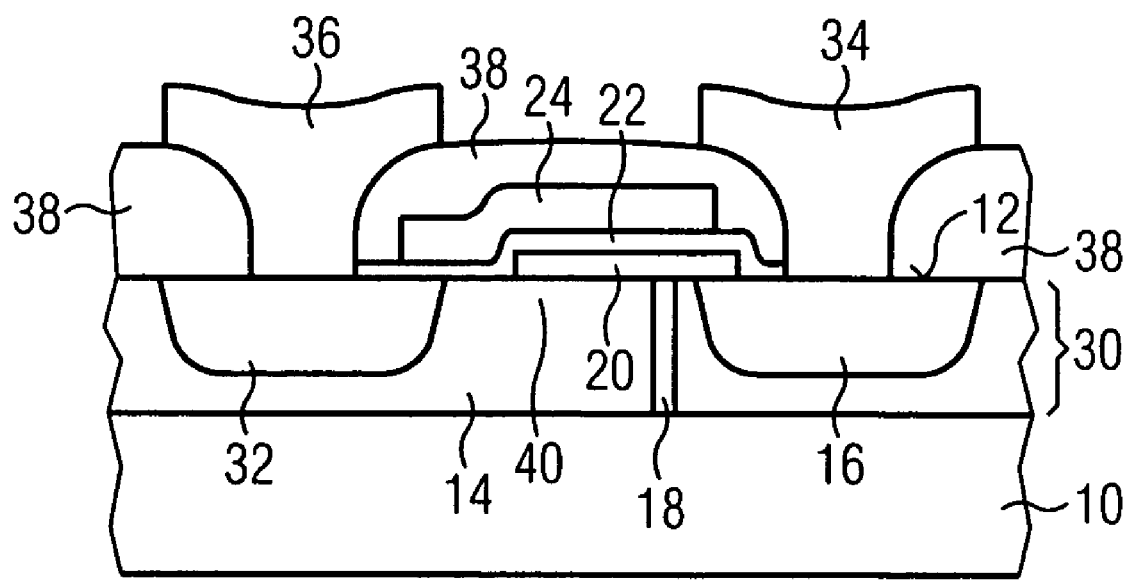
FIG. 2 shows a field effect semiconductor switch in accordance with a second preferred exemplary embodiment of the present invention.

FIG. 2 is a schematic illustration of a vertical section through a field effect semiconductor switch in accordance with a second preferred exemplary embodiment of the present invention. A substrate 10 has, below the surface 12, a component semiconductor layer 30 directly adjoining the surface 12. A first semiconductor region 14 and a second semiconductor region 16 are arranged in the component semiconductor layer 30 and are isolated and electrically insulated from one another by an insulating layer 18. Arranged on the surface 12 of the semiconductor substrate 10 is a semiconductor strip 20, which overlaps both the first semiconductor region 14 and the second semiconductor region 16. Arranged above the semiconductor strip 20 is a gate dielectric 22 and, above the latter, a gate 24. The gate dielectric 22 insulates the gate 24 from the semiconductor strip 20 and the first semiconductor region 14.

A third semiconductor region 32 is arranged in the component semiconductor layer 30 in a manner adjoining the first semiconductor region 14 and is spatially at a distance from the insulating layer 18 and the second semiconductor region 16. The gate 24 in each case at least partially overlaps the first semiconductor region 14, the second semiconductor region 16, the third semiconductor region 32 and the semiconductor strip 20. Contacts 34, 36 made of conductive material, for example polycrystalline semiconductor material or metal, make contact with the second semiconductor region 16 and the third semiconductor region 32. An insulator 38 is arranged between the contacts 34, 36 and the gate 24 and insulates the same from one another.

The exemplary embodiment of the present invention as illustrated in FIG. 2 has features and properties of a field effect transistor. The second and third semiconductor regions 16, 32 form transistor electrodes designated as source region and drain region, respectively, in the conventional field effect transistor. They are preferably highly doped and both have the same majority charge carriers.

The first semiconductor region 14 is preferably weakly doped and has majority charge carriers of the opposite sign, by way of example. In the first semiconductor region 14, a conductive channel forms in a channel region 40 at the surface 12 of the substrate 10 in a manner dependent on the voltage at the gate 24. However, the channel does not directly connect source region and drain region to one another. Rather, an electrically conductive connection between the third semiconductor region 32 and the second semiconductor region 16 is possible only via the channel region 40 and the semiconductor strip 20.

The voltage at the gate 24 also controls the conductivity of the semiconductor strip 20 besides the conductivity of the channel region 40. Even if the electrical conductivity of the channel region 40 cannot or cannot readily be depleted on account of an outdiffusion of dopant from the third semiconductor region 32 into the first semiconductor region 14 or on account of an extended space charge zone, the thin semiconductor strip 20 can nevertheless readily be fully depleted by applying a corresponding voltage to the gate 24. The field effect semiconductor switch according to the invention as illustrated in FIG. 2 therefore has a particularly low leakage current or a particularly high source-drain resistance.

In the illustration in FIG. 2, the insulating layer 18 extends, in a manner similar to that in FIG. 1, in a direction perpendicular to the surface 12 from the surface 12 into the substrate to a depth such that there is no or only a very high-resistance electrical connection between the first semiconductor region 14 and the second semiconductor region 16. For this purpose, the insulating layer 18, preferably as illustrated in FIG. 2, extends over the entire thickness of the component semiconductor layer 30. The insulating layer 18 may be formed for example by a deep trench filled with an electrically insulating material.

As an alternative, a corresponding insulating layer completely surrounds the second semiconductor region 16 up to the surface 12 in the form of a well. This alternative is particularly advantageous if the second semiconductor region 16 is formed by a corresponding recess firstly being formed below the surface 12 in the component semiconductor layer 30. The recess is then completely lined by an insulating layer, for example by means of a thermal oxidation or by depositing an insulator. The recess is subsequently filled by a semiconductor material which then forms the second semiconductor region 16.

Features of the exemplary embodiments illustrated with reference to FIGS. 1 and 2 can readily be combined. By way of example, the way in which the first semiconductor region 14 and the second semiconductor region 16 are electrically insulated from one another is completely unimportant for the present invention. The first semiconductor region 14 and/or the second semiconductor region 16 may be insulated by an insulation layer in the form of a well, as explained above with reference to FIG. 2. As an alternative, as illustrated in FIGS. 1 and 2, they are insulated from one another in the lateral direction by an insulating layer 18. The insulating layer 18 may penetrate through the semiconductor layer in which the semiconductor regions 14, 16 are arranged or the substrate 10 through its entire thickness, as is suggested by the schematic illustration in FIG. 1, or else just a component layer 30, as is illustrated in FIG. 2. Insulation from, if appropriate, adjoining electrically conductive layers of the semiconductor substrate 10 is then effected by means of a varied insulating layer, a reverse-biased pn junction or other measures. It is furthermore possible for the insulating layer 18 to reach right into a depth of the substrate in which the latter is undoped and thus has a low electrical conductivity.

In FIG. 2, the insulating layer 18 adjoins a channel region 40 on one side, the electrical conductivity of said channel region being controlled by the gate 24. The other side of the insulating layer 18 adjoins the second semiconductor region 16, which has a permanent (high) electrical conductivity. In a further variation of the field effect semiconductor switch according to the invention, channel regions are arranged on both sides of the insulating layer 18, the electrical conductivity of which channel regions can be varied by means of the electrostatic potential or potentials from one or else a plurality of gates.

In this case, the channel region or regions 40 and the semiconductor strip 20 preferably perform different electrical functions. The semiconductor strip 20 enables a very high-resistance switched-off state of the field effect semiconductor switch with a low leakage current, while the channel region 40 enables a fine setting of the resistance for analog applications.

As has already been explained above, a field effect semiconductor switch according to the invention can readily be greatly miniaturized since its leakage current in the switched-off state is not or not significantly increased by an outdiffusion of dopant or by space charge zones. Field effect semiconductor switches in accordance with the present invention are therefore particularly suitable for integrated analog and digital semiconductor components and in particular for memory components.

In the case of a memory component in accordance with the present invention, a field effect semiconductor switch according to the invention replaces a conventional selection transistor. Depending on the concrete configuration of the field effect semiconductor switch and of the storage capacitor, these have common features which are simultaneously functional elements of the storage capacitor and of the field effect semiconductor switch. This effects further miniaturization and thus a reduction of the chip area requirement and of the fabrication costs. One example of such a memory component is described below with reference to FIG. 3.

Figure 3:
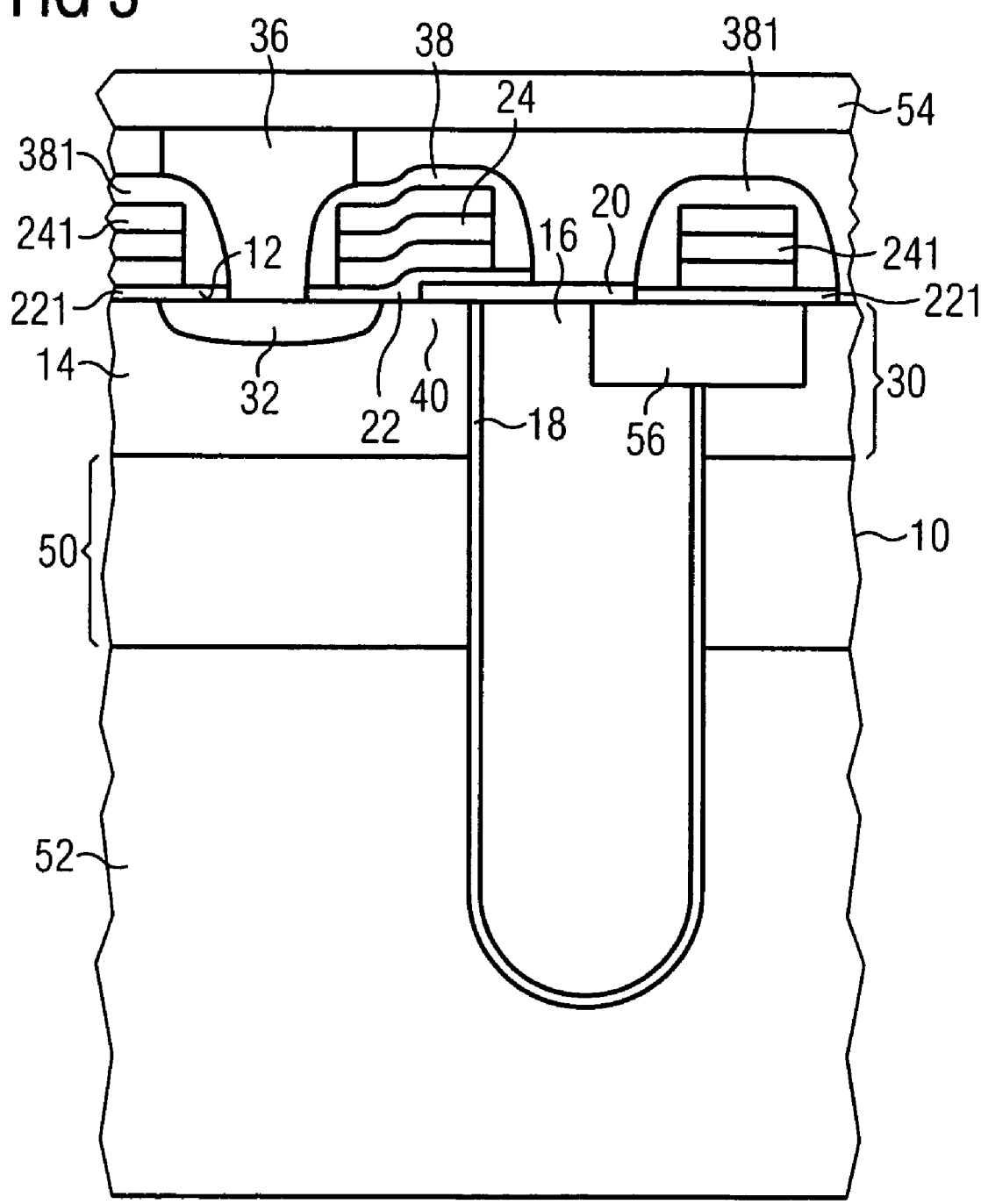
FIG. 3 shows a memory component in accordance with a further preferred exemplary embodiment of the present invention.

FIG. 3 is a schematic illustration of a vertical section through a memory component in accordance with a preferred exemplary embodiment of the present invention. At its surface 12, a substrate 10 has a preferably weakly doped component semiconductor layer with majority charge carriers having a first sign. Underneath the substrate 10 has a buried semiconductor layer 50 with majority charge carriers having a second, opposite sign. In a region 52 below the buried semiconductor layer 50, the substrate 10 has majority charge carriers having the same sign as in the component semiconductor layer 30. The component semiconductor layer 30 and the region 52 of the substrate 10 are thus electrically insulated from one another by pn junctions between the component semiconductor layer 30 and the buried semiconductor layer 50 and also between the buried semiconductor layer 50 and the region 52.

Arranged in the substrate 10 is a trench capacitor that extends in the vertical direction from the surface 12 right into the region 52 of the substrate 10. The region 52 of the substrate 10 forms the outer capacitor electrode of the trench capacitor. An insulating layer 18 essentially completely surrounds an inner capacitor electrode 16 in the form of a well and extends in particular as far as the surface 12 of the substrate 10. The insulating layer 18 insulates the inner capacitor electrode 16 from the region 52 and from surrounding regions of the component layer 30. Since the insulating layer 18 forms the dielectric of the trench capacitor, it is preferably as thin as possible and has a highest possible relative permeativity or dielectric constant.

A transistor electrode 32 is arranged in the component semiconductor layer 30 below the surface 12 of the substrate 10. A contact 36 connects the transistor electrode 32 to a bit line 54, which is arranged above the substrate 10 at a distance from the surface 12 and essentially parallel thereto.

A semiconductor strip 20 on the surface 12 in each case at least partially overlaps the inner capacitor electrode 16 and an adjacent first semiconductor region 14 in the component layer 30. A gate 24 in each case at least partially overlaps the semiconductor strip 20, the inner capacitor electrode 16, the first semiconductor region 14 and the transistor electrode 32 and is spatially isolated and electrically insulated from these by a gate dielectric 22.

In this exemplary embodiment, the gate 24 has a structure comprising three layers, for example polysilicon, tungsten silicide and tungsten. An insulator 38 is deposited above the gate 24 such that the gate 24 is completely surrounded by the gate dielectric 22 and the insulator 38 and is insulated from its surroundings by these. In a channel region 40 near the surface 12 below the gate 24, a conductive channel forms between the transistor electrode 32 and the semiconductor strip 20 if a suitable potential is applied to the gate 24.

The inner capacitor electrode 16, the semiconductor strip 20, the first semiconductor region 14 with the channel region 40 and the transistor electrode 32 form a variant of the field effect semiconductor switch according to the present invention. The field effect semiconductor switch and the trench capacitor form a memory cell of the memory component. The memory component preferably has a multiplicity of memory cells arranged in a two-dimensionally periodic structure at the surface 12.

A plurality of bit lines 54 run parallel to one another along one direction. Each bit line 54 is connected via a plurality of contacts 36 to a plurality of memory cells arranged below the bit line 54. The gates 24 of the memory cells are connected with respect to a plurality of word lines which run parallel to one another and perpendicular to the bit lines 54 above the surface 12 of the substrate 10. The region 52 of the substrate 10 forms the common outer electrode of the trench capacitors of the memory cells.

Furthermore, FIG. 3 illustrates gates 241, 242 that are surrounded by insulators 381, 382 and gate dielectrics 221, 222 and are associated with adjacent word lines or form the latter. In order to reduce an electrostatic capacitance between the gate 241 of the adjacent word line and the inner capacitor electrode 16 of the memory cell, a shallow isolation trench 56 is provided between the same.

A word line is activated by applying a first predetermined voltage to it and thus to the gates 24 connected to the word line, the semiconductor strip 20 and the channel region 40 becoming conductive at said first predetermined voltage. Preferably, the other word lines simultaneously have a second predetermined voltage, at which the semiconductor strip and the channel region are electrically insulating. As a result, each bit line 54 is connected to precisely one inner capacitor electrode 16 of a single memory cell. Via the bit line 54, the charge of the trench capacitor is sensed in order to read the memory cell, or refreshed or replaced by a new charge in order to write information to the memory cell.

In FIG. 3, the inner capacitor electrode 16 is illustrated as a homogeneous structure reaching as far as the surface 12 of the substrate 10. In a departure from this it is possible to distinguish functionally and/or structurally between the inner capacitor electrode directly opposite the region 52 and a second semiconductor region which adjoins it homogeneously or inhomogeneously and extends as far as the surface 12 and the semiconductor strip 20 without this influencing the function of the memory component according to the invention, however.

The memory component described above with reference to FIG. 3 may contain a plurality of the memory cells illustrated. The semiconductor strips 20 of the semiconductor switches described above with reference to FIGS. 1 and 2 and of the memory component described above with reference to FIG. 3 are in each case produced in a separate method step. They are preferably delimited in the lateral direction by an edge which preferably has approximately the form of a rectangle or an oval.

Even if the material of the semiconductor strip and the material of one of the two semiconductor regions which it adjoins match, the semiconductor strip is distinguishable and identifiable by said edge. At the edge, the surface of the common material of the semiconductor strip and of the underlying semiconductor region has a step with a height corresponding to the thickness of the semiconductor strip.

If the surface 12 of the substrate 10 is planar on account of a cmp step (cmp=chemical mechanical polishing), for example, the semiconductor strip has the form of a (flat) parallelepiped or more generally of a body with two parallel areas. If the surface 12 is not planar, the semiconductor strip has a corresponding form.

In the fabrication of a memory component according to the invention, firstly one or a plurality of storage capacitors having in each case an insulating layer 18 reaching up to the surface 12 of the substrate is produced in the substrate 10, as has been described above with reference to FIG. 3. In this case, a region 52 adjoining the insulating layer 18 on the exterior serves as a common capacitor electrode. The first semiconductor region 14 and the second semiconductor region 16, which is connected to the inner capacitor electrode of the storage capacitor or merges into it, are produced at the surface 12 of the substrate 10. The semiconductor strip 20 is subsequently produced on the surface 12 of the substrate 10. The gate dielectric 22 and the gate 24 are then produced thereabove. If the substrate 10 is subjected to heat treatment during processing or is exposed for some other reason to a high temperature at which dopants of the semiconductor regions 14, 16 diffuse in a manner that is no longer negligible, the semiconductor strip 20 is preferably not produced until after this step.

LIST OF REFERENCE SYMBOLS 10 substrate
12 surface
14 first semiconductor region
16 second semiconductor region
18 insulating layer 20 semiconductor strip
22 gate dielectric
24 gate
30 component semiconductor layer
32 third semiconductor region
34 contact
36 contact
38 insulator
40 channel region
50 buried semiconductor layer
52 region
54 bit line
56 shallow isolation trench
221, 222 gate dielectric
241, 242 gate
381, 382 insulator

What is claimed is:

1. A field effect semiconductor switch, comprising:
  a semiconductor layer having a surface;
  a first and a second semiconductor region in the semiconductor layer, the first and second semiconductor regions being arranged next to one another at the surface of the semiconductor layer, wherein the first semiconductor region is a transistor electrode;
  an insulating layer between the first semiconductor region and the second semiconductor region;
  a semiconductor strip on the surface of the semiconductor layer, the semiconductor strip overlapping and adjoining the first semiconductor region and the second semiconductor region;
  a gate, which overlaps the semiconductor strip at least in the region of the insulating layer; and
  a gate dielectric, which insulates the gate from the semiconductor strip, the first semiconductor region and the second semiconductor region,
  the semiconductor strip and the gate being formed, with regard to its lateral extent, such that the semiconductor strip is electrically insulating at a first predetermined gate voltage and is electrically conductive at a second predetermined gate voltage, as a result of which the first and second semiconductor regions are electrically insulated from one another at the first predetermined gate voltage and are electrically conductively connected to one another by the semiconductor strip at the second predetermined gate voltage.

2. The field effect semiconductor switch as claimed in claim 1, wherein the insulating layer reaches as far as the surface of the semiconductor layer.

3. The field effect semiconductor switch as claimed in claim 1, wherein the gate at least partially overlaps the first semiconductor region and/or the second semiconductor region.

4. The field effect semiconductor switch as claimed in claim 1, wherein the semiconductor strip has a thickness of 50 nm or less.

5. The field effect semiconductor switch as claimed in claim 1, wherein the second semiconductor region is a further transistor electrode.

6. A field effect semiconductor switch, comprising:
  a semiconductor layer having a surface;
  a first and a second semiconductor region in the semiconductor layer, the first and second semiconductor regions being arranged next to one another at the surface of the semiconductor layer, wherein the first semiconductor region is a transistor electrode;
  an insulating layer between the first semiconductor region and the second semiconductor region;
  a semiconductor strip on the surface of the semiconductor layer, the semiconductor strip overlapping and adjoining the first semiconductor region and the second semiconductor region;
  a gate, which overlaps the semiconductor strip at least in the region of the insulating layer; and
  a gate dielectric, which insulates the gate from the semiconductor strip, the first semiconductor region and the second semiconductor region;
  wherein the first semiconductor region comprises a channel region adjoining the surface of the semiconductor layer, the gate completely overlapping the channel region and the first semiconductor region and the channel region adjoining a transistor electrode.

7. The field effect semiconductor switch of claim 6, wherein the semiconductor strip and the gate are formed, with regard to its lateral extent, such that the semiconductor strip is electrically insulating at a first predetermined gate voltage and is electrically conductive at a second predetermined gate voltage, as a result of which the first and second semiconductor regions are electrically insulated from one another at the first predetermined gate voltage and are electrically conductively connected to one another by the semiconductor strip at the second predetermined gate voltage.

8. An integrated semiconductor component having a field effect semiconductor, comprising:
  a semiconductor layer having a surface;
  a first and a second semiconductor region in the semiconductor layer, which are arranged next to one another at the surface of the semiconductor layer, wherein the first semiconductor region is a transistor electrode;
  an insulating layer between the first semiconductor region and the second semiconductor region;
  a semiconductor strip on the surface of the semiconductor layer, wherein the semiconductor strip overlaps the first semiconductor region and the second semiconductor region and adjoins the first semiconductor region and the second semiconductor region;
  a gate, which overlaps the semiconductor strip at least in the region of the insulating layer; and
  a gate dielectric, which insulates the gate from the semiconductor strip, the first semiconductor region and the second semiconductor region,
  the semiconductor strip and the gate being formed, with regard to its lateral extent, such that the semiconductor strip is electrically insulating at a first predetermined gate voltage and is electrically conductive at a second predetermined gate voltage, as a result of which the first and second semiconductor regions are electrically insulated from one another at the first predetermined gate voltage and are electrically conductively connected to one another by the semiconductor strip at the second predetermined gate voltage.

9. A memory component, comprising:
  a field effect semiconductor switch having
    a semiconductor layer having a surface;
    a first and a second semiconductor region in the semiconductor layer, which are arranged next to one another at the surface of the semiconductor layer;
    an insulating layer between the first semiconductor region and the second semiconductor region;
    a semiconductor strip on the surface of the semiconductor layer, wherein the semiconductor strip overlaps the first semiconductor region and the second semiconductor region and adjoins the first semiconductor region and the second semiconductor region;

a gate, which overlaps the semiconductor strip at least in the region of the insulating layer; and a gate dielectric, which insulates the gate from the semiconductor strip, the first semiconductor region and the second semiconductor region, the semiconductor strip and the gate being formed, with regard to its lateral extent, such that the semiconductor strip is electrically insulating at a first predetermined gate voltage and is electrically conductive at a second predetermined gate voltage, as a result of which the first and second semiconductor regions are electrically insulated from one another at the first predetermined gate voltage and are electrically conductively connected to one another by the semiconductor strip at the second predetermined gate voltage; and a storage capacitor, the second semiconductor region being connected to a capacitor electrode of the storage capacitor.

10. The memory component as claimed in claim 9, wherein the storage capacitor is a trench capacitor, an inner capacitor electrode of which is connected to the second semiconductor region.

11. The memory component as claimed in claim 10, wherein a substrate has a component semiconductor layer at the surface and a conductive layer, which is arranged below the component semiconductor layer and is insulated from the latter, an outer capacitor electrode of the trench capacitor being connected to a buried conductive layer and being insulated from the component semiconductor layer, the insulating layer being a dielectric layer of the capacitor.

12. The memory component as claimed in claim 9, wherein the first semiconductor region is connected to a bit line and the gate is connected to a word line.

13. A memory component, comprising:
a field effect semiconductor switch having:
a substrate having a surface;
a first and a second semiconductor region in the substrate which are arranged next to one another at the surface of the substrate,
an insulating layer between the first semiconductor region and the second semiconductor region,
a semiconductor strip on the surface of the substrate, wherein the semiconductor strip overlaps the first semiconductor region and the second semiconductor region and adjoins the first semiconductor region and the second semiconductor region,
a gate, which overlaps the semiconductor strip at least in the region of the insulating layer and by means of which the conductivity of the semiconductor strip is switchable, and
a gate dielectric, which insulates the gate from the semiconductor strip, the first semiconductor region and the second semiconductor region; and
a storage capacitor, one capacitor electrode of which is connected to the second semiconductor region, the insulating layer being a dielectric layer of the storage capacitor.

14. A method for fabricating an integrated circuit, the method comprising:
providing a substrate having a surface;
forming a storage capacitor adjacent the surface of the substrate;
forming a first semiconductor region adjacent the surface of the substrate;
forming a second semiconductor region adjacent the surface of the substrate adjacent to the first semiconductor region, the second semiconductor region being separated from the first semiconductor region by an insulating region;
forming a semiconductor strip that overlaps the first semiconductor region and the second semiconductor region and adjoins these the first semiconductor region and the second semiconductor region; and
forming a gate dielectric and a gate above the semiconductor strip, the gate dielectric insulating the gate from the semiconductor strip, and the gate at least partially overlapping the first semiconductor region and the second semiconductor region, the semiconductor strip being formed such that it is electrically insulating at a first predetermined gate voltage and is electrically conductive at a second predetermined gate voltage.

15. The method as claimed in claim 14, further comprising heating the substrate, the semiconductor strip being produced after the heating step.

16. The method of claim 14, wherein the first and second semiconductor regions are formed in the substrate.

17. A method for fabricating a memory component having field effect semiconductor switch, comprising:
providing a substrate having a surface;
forming a storage capacitor in the substrate;
forming a first semiconductor region in the substrate at the surface of the substrate;
forming a second semiconductor region in the substrate at the surface of the substrate adjacent to the first semiconductor region, the second semiconductor region being connected to a capacitor electrode of the storage capacitor;
forming an insulating layer between the first semiconductor region and the second semiconductor region, the insulating layer being a dielectric layer of the storage capacitor;
forming a semiconductor strip, which overlaps the first semiconductor region and the second semiconductor region and adjoins the first semiconductor region and the second semiconductor region, on the surface of the substrate; and
forming a gate dielectric and a gate above the semiconductor strip, the gate dielectric insulating the gate from the semiconductor strip, and the gate at least partially overlapping the first semiconductor region and the second semiconductor region,
the semiconductor strip being formed such that it is electrically insulating at a first predetermined gate voltage and is electrically conductive at a second predetermined gate voltage.

18. An integrated circuit, comprising:
a semiconductor body having a surface;
a first source/drain region at the surface of the semiconductor body;
a second source/drain region at the surface of the semiconductor body;
an insulating layer disposed between the first source/drain region and the second source/drain region;
a semiconductor strip overlying the surface of the semiconductor body, the semiconductor strip overlapping the first source/drain region and the second source/drain region;
a gate dielectric overlying the semiconductor strip, the gate dielectric comprising a non-planar layer; and
a gate overlying the gate dielectric and insulated from the semiconductor strip by the gate dielectric.

19. The integrated circuit of claim 18, wherein the gate comprises a planar structure that overlies only a portion of the gate dielectric.

20. An integrated circuit, comprising:

a semiconductor body having a surface;

a first source/drain region at the surface of the semiconductor body;

a second source/drain region at the surface of the semiconductor body;

an insulating layer disposed between the first source/drain region and the second source/drain region;

a semiconductor strip overlying only a portion of the surface of the semiconductor body, the semiconductor strip overlapping the first source/drain region and the second source/drain region;

a gate dielectric overlying the semiconductor strip, the gate dielectric comprising a non-planar layer;

a gate overlying the gate dielectric and insulated from the semiconductor strip by the gate dielectric; and an insulating region overlying the semiconductor body, a first portion of the insulating region overlying the semiconductor strip and a second portion of the insulating region overlying the first source/drain region but not the semiconductor strip.

21. The integrated circuit of claim 20, wherein the first and second source/drain regions are disposed within the semiconductor body.

22. The integrated circuit of claim 20, wherein the gate dielectric includes a first portion overlying a top surface of the semiconductor strip parallel to the surface of the semiconductor body and a second portion along a sidewall of the semiconductor strip.

23. The integrated circuit of claim 22, wherein the gate dielectric comprises a planar structure that only overlies the top surface of the semiconductor strip.

* * * * *

UNITED STATES PATENT AND TRADEMARK OFFICE
CERTIFICATE OF CORRECTION

| | |
|---|---|
| PATENT NO. | : 7,402,859 B2 |
| APPLICATION NO. | : 11/079884 |
| DATED | : July 22, 2008 |
| INVENTOR(S) | : Vollrath et al. |

It is certified that error appears in the above-identified patent and that said Letters Patent is hereby corrected as shown below:

In Col. 12, line 6, after adjoins delete "these".

Signed and Sealed this

Thirtieth Day of September, 2008

JON W. DUDAS
*Director of the United States Patent and Trademark Office*